United States Patent
Oohira (10) Patent No.: US 8,330,734 B2
(45) Date of Patent: Dec. 11, 2012

(54) LIQUID CRYSTAL DISPLAY DEVICE

(75) Inventor: Eiji Oohira, Mobara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 413 days.

(21) Appl. No.: 12/553,223

(22) Filed: Sep. 3, 2009

(65) Prior Publication Data

US 2010/0060601 A1 Mar. 11, 2010

(30) Foreign Application Priority Data

Sep. 5, 2008 (JP) ................................. 2008-228696

(51) Int. Cl.
*G02F 1/1333* (2006.01)
(52) U.S. Cl. ............................. 345/173; 439/67; 349/58
(58) Field of Classification Search ................ None
See application file for complete search history.

(56) References Cited

U.S. PATENT DOCUMENTS

| | | | | |
|---|---|---|---|---|
| 6,342,932 | B1 * | 1/2002 | Terao et al. | 349/58 |
| 7,144,257 | B2 * | 12/2006 | Yumoto et al. | 439/67 |
| 2008/0246744 | A1 * | 10/2008 | Park et al. | 345/173 |

FOREIGN PATENT DOCUMENTS

JP 2008-083491 4/2008

* cited by examiner

*Primary Examiner* — Joseph Haley
(74) *Attorney, Agent, or Firm* — Antonelli, Terry, Stout & Kraus, LLP.

(57) ABSTRACT

A liquid crystal display device having a touch panel and a front window which can enhance reliability thereof and facilitates repair thereof is provided. The touch panel and the front window are mounted on a liquid crystal display device using a thermoplastic adhesive material. Electronic parts are arranged on a lower side of a touch-panel-use flexible printed circuit board, and electronic parts are arranged on a lower side of a main flexible printed circuit board. The respective electronic parts are covered with the front window in a plan view. A light emitting diode is mounted on the main flexible printed circuit board, and faces a light guide plate in a resin mold. Due to such a constitution, an external shape of the liquid crystal display device can be made small as a whole, and relatively expensive light emitting diodes can be reproduced and reused by repair.

11 Claims, 8 Drawing Sheets

LIQUID CRYSTAL DISPLAY DEVICE

CROSS-REFERENCE TO RELATED APPLICATION

The disclosure of Japanese Patent Application No. 2008-228696 filed on Sep. 5, 2008, including the specification, drawings and abstract is incorporated herein by reference in its entirety.

BACKGROUND OF THE INVENTION

1. Field of the Invention

The present invention relates to a liquid crystal display device, and more particularly to a miniaturized display device having a touch panel which is used in a mobile phone or the like.

2. Description of the Related Art

A liquid crystal display device includes a TFT substrate on which pixel electrodes, thin film transistors (TFT) and the like are formed in a matrix array, a color filter substrate which faces the TFT substrate in an opposed manner and forms color filters and the like thereon at positions corresponding to the pixel electrodes formed on the TFT substrate, and liquid crystal which is sandwiched between the TFT substrate and the color filter substrate. An image is formed by controlling optical transmissivity of liquid crystal molecules for every pixel.

The liquid crystal display device can be formed into a miniaturized and thin shape and hence, the liquid crystal display device is used in various usages including a mobile phone and the like. Recently, various kinds of applications are added to a mobile phone. Further, an input device of the mobile phone is also requested to possess a function which allows a user to perform inputting with his finger using a touch panel in addition to a conventional key-button operation. In such a case, the touch panel is mounted on a color-filter-substrate side of a liquid crystal display panel.

On the other hand, the liquid crystal display device is strongly requested to satisfy a demand for the reduction of an external shape size of a set while maintaining a screen at a fixed size and a demand for the reduction of thickness of a liquid crystal display panel simultaneously. To reduce a thickness of the liquid crystal display panel, after manufacturing the liquid crystal display panel, an outer side of the liquid crystal display panel is polished so as to reduce a thickness of the liquid crystal display panel. With respect to a TFT substrate which constitutes the liquid crystal display panel and forms pixel electrodes and TFTs (thin film transistors) and the like thereon and a color filter substrate which also constitutes the liquid crystal display panel and forms color filters thereon, a glass substrate for forming the TFT substrate or the color filter substrate is standardized to have a thickness of 0.5 mm or 0.7 mm, for example. It is difficult to obtain such standardized glass substrates at the market. Further, an extremely thin glass substrate has drawbacks in manufacturing steps with respect to mechanical strength, deflection or the like thus lowering a manufacturing yield ratio. As a result, a liquid crystal display panel is formed using a standardized glass substrate and, thereafter, an outer surface of the liquid crystal display panel is polished so as to reduce a thickness of the liquid crystal display panel.

When the liquid crystal display panel becomes thin, the liquid crystal display panel suffers from mechanical strength. That is, when mechanical pressure is applied to a display screen of the liquid crystal display panel, there exists a possibility that the liquid crystal display panel is broken. On the other hand, a thickness of the touch panel is small and hence, when the touch panel is installed in the liquid crystal display panel, the same problem also arises.

To prevent the liquid crystal display panel from being broken by an external force, a front window made of a resin or glass is mounted on a screen side of the liquid crystal display panel. In this case, an air layer is present between the liquid crystal display panel and the touch panel or between the touch panel and the front window, and transmissivity of light from a backlight is reduced due to the reflection of light from an interface at such a portion.

To overcome this drawback, JP-A-2008-83491 (patent document 1) discloses the constitution where an adhesive layer or a reflection preventing film is formed between the liquid crystal display panel and the touch panel or between the touch panel and the front window.

SUMMARY OF THE INVENTION

A technique disclosed in patent document 1 proposes a countermeasure against lowering of brightness attributed to the reflection of light between the liquid crystal display panel and the touch panel or between the touch panel and the front window. On the other hand, the use of the touch panel and the front window brings about the drawback that a thickness of the display device becomes large as a whole. Further, a mobile phone or the like is requested to satisfy a demand for the reduction of an external shape of the display device as a whole. Such drawback and request are not disclosed in patent document 1.

The task of the present invention lies in the realization of the constitution of a liquid crystal display device having a touch panel and a front window which can reduce a thickness and a size of an external shape thereof without damaging reliability.

The present invention is provided for overcoming the above-mentioned drawbacks, and the followings are specific constitutions of the present invention.

(1) According to one aspect of the present invention, there is provided a liquid crystal display device which includes a liquid crystal display panel and a backlight which are accommodated in a resin mold, a touch panel which is adhered to the liquid crystal display panel, and a front window which is adhered to the touch panel, wherein a main flexible printed circuit board is connected to the liquid crystal display panel, a touch-panel-use flexible printed circuit board is connected to the touch panel, electronic parts arranged on the touch-panel-use flexible printed circuit board are arranged on a side opposite to the front window, and electronic parts arranged on the main flexible printed circuit board are arranged on a side opposite to the front window, the main flexible printed circuit board is folded back to a back surface of the resin mold, a light emitting diode is arranged on a portion of the main flexible printed circuit board which is folded back to the back surface of the resin mold, the light emitting diode is accommodated in the resin mold and forms a portion of the backlight, and the front window covers the electronic parts arranged on the main flexible printed circuit board and the electronic parts arranged on the touch-panel-use flexible printed circuit board as viewed in a plan view.

(2) In the liquid crystal display device having the constitution (1), the liquid crystal display panel and the touch panel are adhered to each other by a thermoplastic resin, and the front window and the touch panel are adhered to each other by a thermoplastic resin.

(3) In the liquid crystal display device having the constitution (1), the touch-panel-use flexible printed circuit board is connected to the main flexible printed circuit board, and is folded back to the back surface of the resin mold.

(4) In the liquid crystal display device having the constitution (1), the touch panel is an electrostatic touch panel.

(5) According to another aspect of the present invention, there is provided a liquid crystal display device which includes a liquid crystal display panel and a backlight which are accommodated in a resin mold, a touch panel which is adhered to the liquid crystal display panel, and a front window which is adhered to the touch panel, wherein a main flexible printed circuit board is connected to the liquid crystal display panel, a touch-panel-use flexible printed circuit board is connected to the touch panel, electronic parts arranged on the touch-panel-use flexible printed circuit board are arranged on a side opposite to the front window, and electronic parts arranged on the main flexible printed circuit board are arranged on a side opposite to the front window, a light-emitting-diode-use flexible printed circuit board branched from the main flexible printed circuit board is folded back and extends along a back surface of the resin mold, a light emitting diode is arranged on a portion of the light-emitting-diode-use flexible printed circuit board extending along the back surface of the resin mold, the light emitting diode is accommodated in the resin mold and forms a portion of the backlight, and the front window covers the electronic parts arranged on the main flexible printed circuit board and the electronic parts arranged on the touch-panel-use flexible printed circuit board as viewed in a plan view.

(6) In the liquid crystal display device having the above-mentioned constitution (5), only the light emitting diode is mounted on the light-emitting-diode-use flexible printed circuit board.

According to the present invention, in the liquid crystal display device which includes the touch panel and the front window, the electronic parts are mounted on a lower side of the touch-panel-use flexible printed circuit board, the electronic parts are mounted on a lower side of the main flexible printed circuit board, and the portions of the respective boards on which the electronic parts are mounted are arranged below the front window and hence, it is possible to effectively use a space thus realizing the miniaturization of a setting of a mobile phone or the like. Further, it is possible to prevent the interference between the electronic parts mounted on the touch-panel-use flexible printed circuit board and the electronic parts mounted on the main flexible printed circuit board.

Further, according to the present invention, when a front window and a touch panel are separated from a liquid crystal display device and are repaired, a relatively expensive LED can be reproduced thus realizing the reduction of manufacturing cost of the liquid crystal display device as a whole.

DESCRIPTION OF THE PREFERRED EMBODIMENTS

The present invention is explained in detail in conjunction with embodiments.

Embodiment 1

Figure 1:
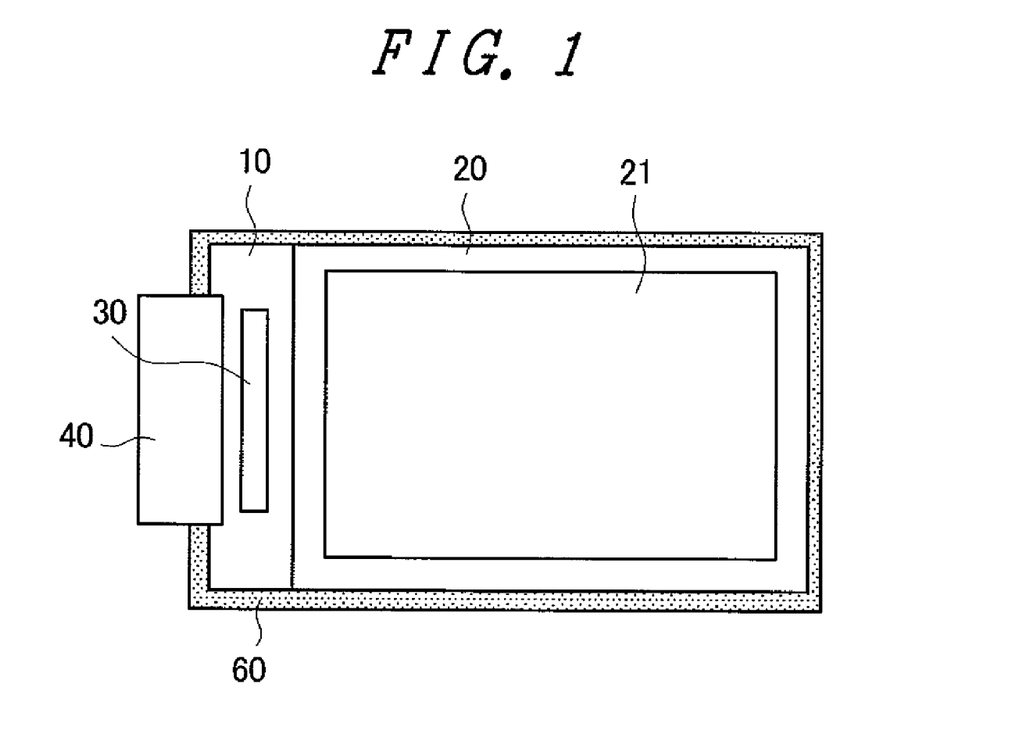
FIG. 1 is a plan view of a liquid crystal display device of an embodiment 1.

FIG. 1 is a plan view of a liquid crystal display panel according to the present invention which is used for a mobile phone or the like. In FIG. 1, a color filter substrate 20 is mounted on a TFT substrate 10. A liquid crystal layer not shown in the drawing is sandwiched between the TFT substrate 10 and the color filter substrate 20. The TFT substrate 10 and the color filter substrate 20 are adhered to each other by a sealing material not shown in the drawing which is formed between picture frame portions of these substrates. The TFT substrate 10 is larger than the color filter substrate 20 in size, and a terminal portion for supplying electricity, video signals, scanning signals and the like to the liquid crystal display panel is formed on a portion of the TFT substrate 10 which is formed by making the TFT substrate 10 larger than the color filter substrate 20.

An IC driver 30 for driving scanning lines, video signal lines and the like is formed on the terminal portion. A scanning line drive circuit and a video signal line drive circuit are formed on the IC driver 30. Scanning signals and video signals are supplied to the IC driver 30 via a main flexible printed circuit board 40 which is connected to the terminal portion.

An upper polarizer 21 is adhered to an upper side of the TFT substrate 10. An external shape of the upper polarizer 21 is substantially equal to a shape of a display region. That is, liquid crystal can control only a polarized light and hence, a lower polarizer 11 is adhered to a lower side of the TFT substrate 10 so as to polarize a light radiated from a backlight into a linear polarized light. The linear polarized light is modulated by the liquid crystal layer so that transmissivity is changed for every pixel thus forming an image. Then, by polarizing (analyzing) the modulated light again using the upper polarizer 21, a viewer can observe an image with his naked eyes.

The whole liquid crystal display panel is accommodated in a frame-shaped resin mold 60. A backlight explained later is accommodated in the resin mold 60 and is arranged below the liquid crystal display panel. In FIG. 1, the main flexible printed circuit board 40 which is connected to the terminal portion of the liquid crystal display panel is folded back at an edge portion of the resin mold 60 and extends along a back surface side of the resin mold 60. Due to such a constitution, an external shape of the liquid crystal display device can be made small.

Figure 2:
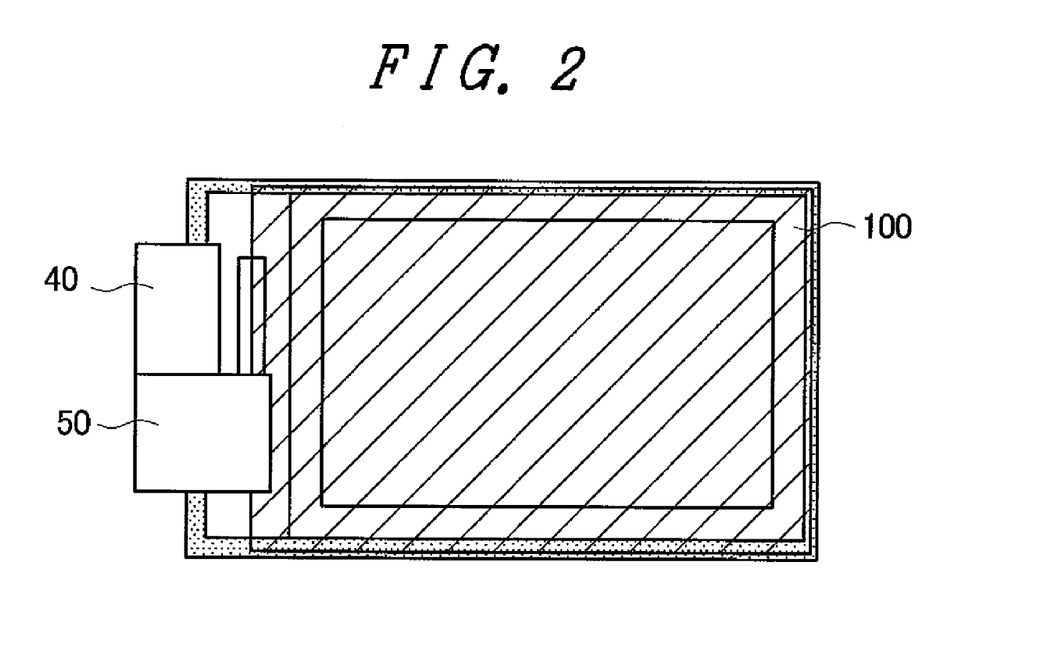
FIG. 2 is a plan view of a liquid crystal display device on which a touch panel is mounted.

FIG. 2 is a view showing a state in which a touch panel 100 is adhered to the liquid crystal display panel explained in conjunction with FIG. 1. The touch panel 100 is formed slightly larger than the color filter substrate 20 of the liquid crystal display panel in size and covers a portion of the resin mold 60. In FIG. 2, a touch-panel-use flexible printed circuit board 50 which supplies electricity and signals to the touch panel 100 is mounted on an edge portion of the touch panel 100. The touch-panel-use flexible printed circuit board 50 is also folded back to the back surface of the mold at the edge portion of the mold thus making the external shape of the liquid crystal display device small. Here, the main flexible printed circuit board 40 and the touch-panel-use flexible printed circuit board 50 are connected to each other on a back surface side of the mold.

Figure 6:
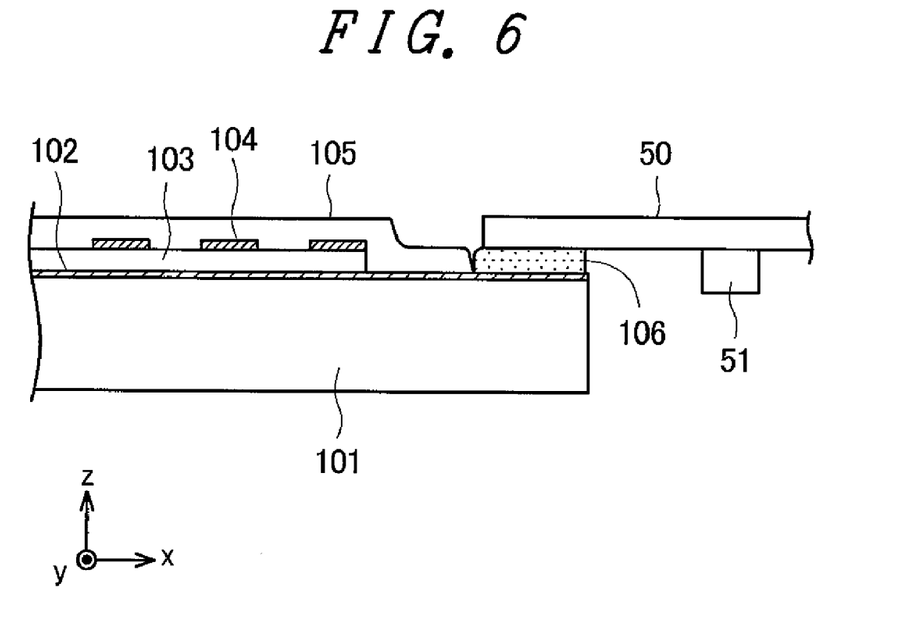
FIG. 6 is a schematic cross-sectional view of the touch panel.

The touch panel 100 shown in FIG. 2 is an electrostatic capacitive touch panel 100. FIG. 6 schematically shows a cross section of the electrostatic capacitive touch panel 100. In FIG. 6, lower lines 102 are formed on the touch panel substrate 101, an insulation layer 103 is formed on the lower lines 102, upper lines 104 are formed on the insulation layer 103, and a protective film 105 is formed in a state that the protective film 105 covers the upper lines 104.

Although the touch panel substrate 101 is generally made of glass, the touch panel substrate 101 may be formed of a plastic substrate provided that the plastic substrate is transparent and can withstand an annealing temperature of ITO or the like. As a transparent resin, for example, an acrylic resin, a polycarbonate resin or the like can be used.

The lower lines 102 are formed on a surface of the touch panel substrate 101. The lower lines 102 are formed of a transparent conductive film made of ITO. After covering a surface of the touch panel substrate 101 with ITO by sputtering, an ITO film is patterned in a stripe shape thus forming the lower lines 102 which extend in the x direction and are arranged parallel to each other in the y direction, that is, in the direction perpendicular to a plane of the drawing in FIG. 6.

The insulation layer 103 is formed of a $SiO_2$ film or a SiN film in a state that the insulation layer 103 covers the lower lines 102. Upper lines 104 are formed on the insulation layer 103. The upper lines 104 are also formed of a transparent conductive film made of ITO. After covering a surface of the insulation layer 103 with ITO by sputtering, the ITO film is patterned in a stripe shape thus forming the upper lines 104. The upper lines 104 extends in the y direction in the drawing, that is, in the direction perpendicular to a plane of the drawing in FIG. 6 and are arranged parallel to each other in the x direction in FIG. 6.

In FIG. 6, the lower lines 102 and the upper lines 104 are arranged to orthogonally intersect with each other so that the lower lines 102 and the upper lines 104 form sides of respective squares as viewed in a plan view. On the other hand, the lower lines 102 and the upper lines 104 may be patterned in a stripe shape in the oblique directions with respect to an external shape of the touch panel 100. In this case, the lower lines 102 and the upper lines 104 form sides of respective rhombic shapes as viewed in a plan view.

The upper lines 104 are covered with and protected by the protective film 105 which is formed of a $SiO_2$ film or a SiN film. In this embodiment, a front window 200 is arranged on the touch panel 100. However, when the front window 200 is not arranged on the touch panel 100, a dedicated pen or a user's finger directly touches the touch panel 100. Even in such a case, the protective film 105 can prevent the respective lines from being damaged.

When the dedicated pen or the finger touches the protective film 105 or the front window 200 which covers upper electrodes from above, an electrostatic capacitance is generated between the upper lines 104 and the dedicated pen or the finger and hence, a charge which is generated between the upper electrode and the lower electrode arranged at a position where the dedicated pen or the finger touches the front window 200 moves whereby the position can be detected.

In FIG. 6, the upper line 104 is made conductive with the terminal portion of the touch panel 100 via a through hole (not shown in the drawing) formed in the insulation layer 103. Accordingly, the terminal of the touch panel 100 can supply signals and an electric current to both of the upper lines 104 and the lower lines 102 and hence, it is sufficient to provide one touch-panel-use flexible printed circuit board 50 to be connected to the terminal. The touch-panel-use flexible printed circuit board 50 is connected to the terminal portion of the touch panel 100 by way of an anisotropic conductive film 106.

The touch panel substrate 101 is mounted on the color filter substrate 20 of the liquid crystal display panel using an adhesive material or a tacky adhesive material. In using the adhesive material, for example, an ultraviolet curing resin is used. The ultraviolet curing resin is in a liquid form in an initial state and hence, when the adhesion of the liquid crystal display panel and the touch panel 100 to each other is performed in a reduced-pressure atmosphere thus preventing air bubbles from entering the ultraviolet curing resin. On the other hand, In using the tacky adhesive material, for example, an acrylic transparent tacky adhesive material is used. In both the case where the adhesive material is used and the case where the tacky adhesive material is used, a thermoplastic resin is used. This is because when a defect such as air bubbles, foreign materials or the like is found after the completion of the adhesion, the front window 200, the touch panel 100 or the liquid crystal display panel can be peeled off for repairing them.

Figure 3:
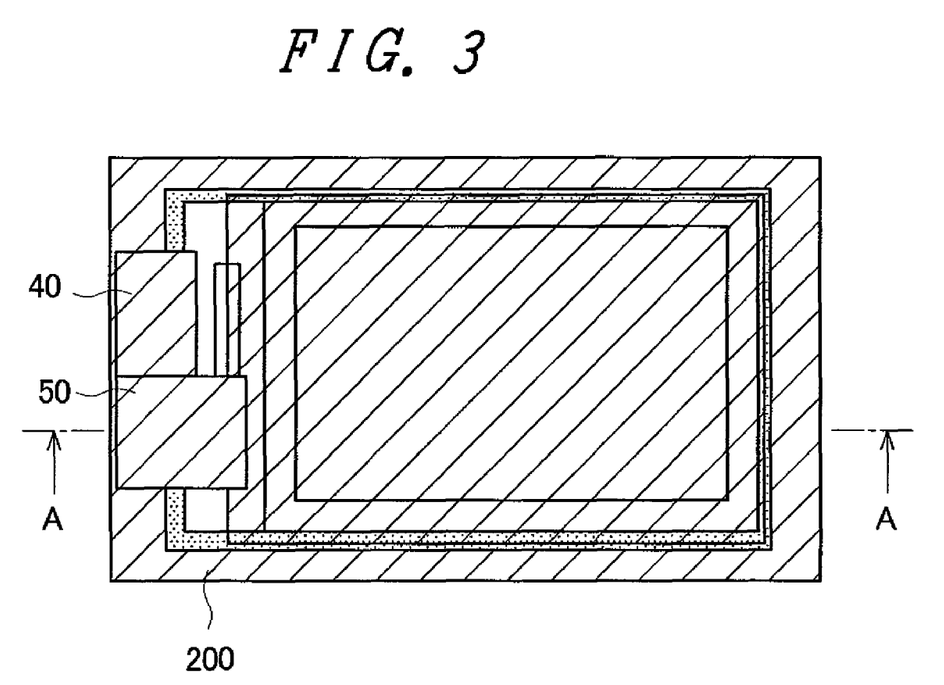
FIG. 3 is a view showing a liquid crystal display device on which a front window is mounted.

FIG. 3 is a view showing a state where the front window 200 is mounted on the structural body which is obtained by mounting the touch panel 100 on the liquid crystal display panel in the step shown in FIG. 2. The front window 200 is generally made of glass and has a thickness of approximately 0.5 mm. As a material of the front window 200, it is also possible to use a transparent plastic material such as an acrylic resin or a polycarbonate resin.

Mounting of the front window 200 is performed such that the protective film 105 of the touch panel 100 and the front window 200 are adhered to each other by providing an adhesive material or a tacky adhesive material between the protective film 105 of the touch panel 100 and the front window 200. When the adhesive material is used, an ultraviolet curing resin is used as the adhesive material. The manner of adhesion is substantially equal to the manner of adhesion between the touch panel 100 and the liquid crystal display panel. A transparent acrylic resin can be used as the tacky adhesive material. In this case, as the adhesive material or the tacky adhesive material, a thermoplastic resin is used.

In FIG. 3, an external shape of the front window 200 is set larger than the liquid crystal display panel and the resin mold 60 so that the front window 200 protects the whole surface of the liquid crystal display panel and the like. Further, the front window 200 also covers and protects the main flexible printed circuit board 40 mounted on the TFT substrate 10 and the touch-panel-use flexible printed circuit board 50 mounted on the touch panel 100.

Figure 4:
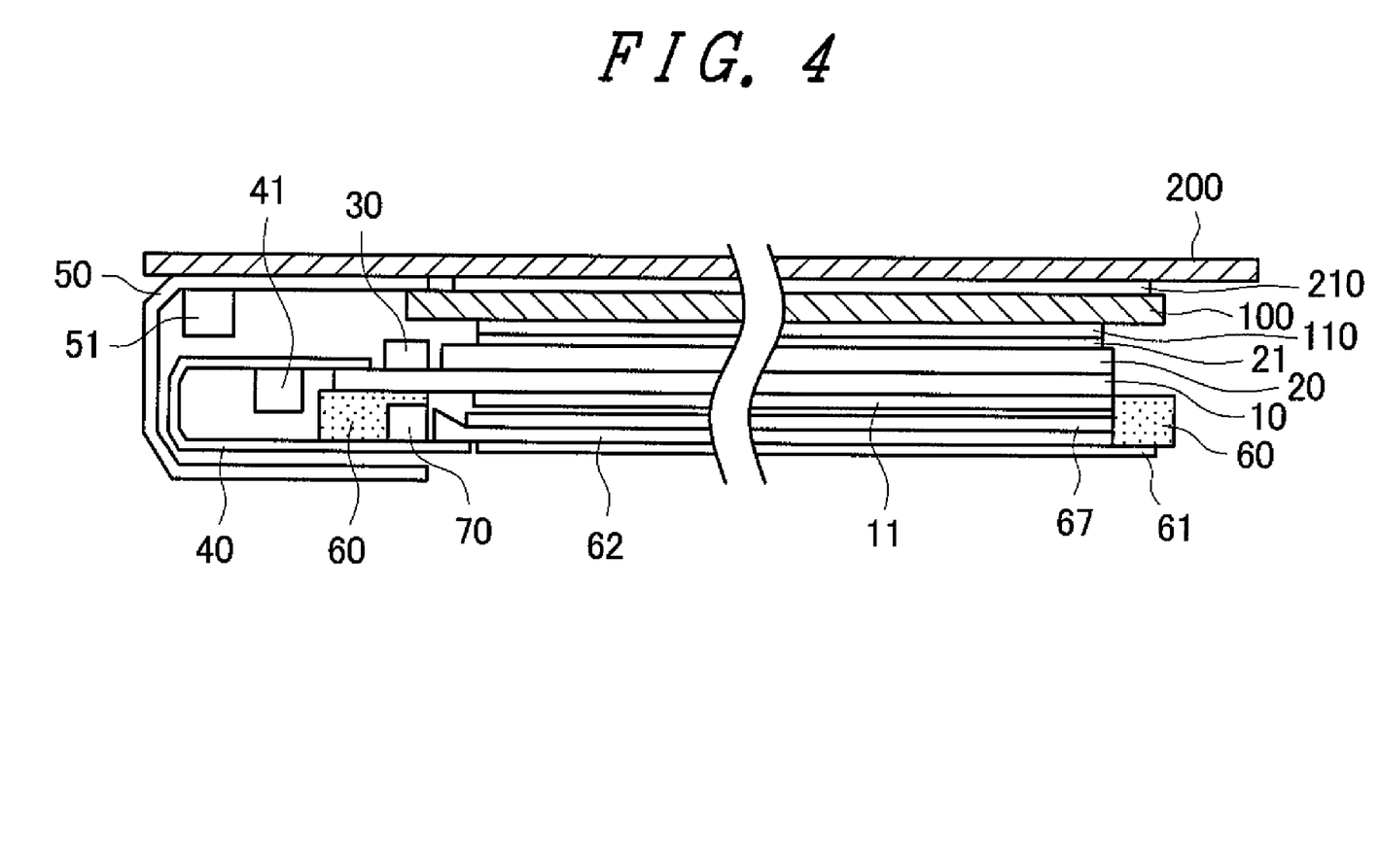
FIG. 4 is a cross-sectional view of the liquid crystal display device shown in FIG. 3.

FIG. 4 is a cross-sectional view taken along a line A-A in FIG. 3. In this specification, the structural body which is obtained by assembling the TFT substrate 10 and the color filter substrate 20 is referred to as a liquid crystal cell, and the structural body which is obtained by adhering the lower polarizer 11 and the upper polarizer 21 to the liquid crystal cell is referred to as a liquid crystal display panel. To the upper polarizer 21 which is adhered to the color filter substrate 20, the touch panel 100 is adhered by way of a first tacky adhesive material 110. The structure of the touch panel is explained previously.

The front window 200 is adhered to an upper surface of the touch panel 100 by way of a second tacky adhesive material 210. The front window 200 has a large external shape so that the front window 200 covers not only the touch panel 100 but also the touch-panel-use flexible printed circuit board 50 and the main flexible printed circuit board 40. In this embodiment, both the first tacky adhesive material 110 and the second tacky adhesive material 210 are formed of a transparent acrylic tacky adhesive material.

The touch-panel-use flexible printed circuit board 50 is connected to the touch panel 100. Touch-panel-use electronic parts 51 are arranged on the touch-panel-use flexible printed circuit board 50. These touch-panel-use electronic parts 51 are mounted on a lower side of the touch-panel-use flexible printed circuit board 50. Although only one touch-panel-use electronic part 51 is described in FIG. 4, FIG. 4 schematically shows the constitution of the liquid crystal display device, and in an actual liquid crystal display panel, ten or more electronic parts 51 are mounted on the lower side of the touch-panel-use flexible printed circuit board 50.

Before being assembled in the manner shown in FIG. 4, the touch panel 100 is arranged in a tray and is transported. Here, when the electronic parts are mounted on the touch panel 100 such that the electronic parts project downwardly, there may be a case that the electronic part is damaged due to a contact between the tray and the electronic part and becomes defective. Accordingly, the touch-panel-use electronic parts 51 are mounted on an upper side of the touch-panel-use flexible printed circuit board 50.

On the other hand, in the present invention, the front window 200 is formed larger than the liquid crystal display panel in size thus protecting the whole liquid crystal display panel. To realize such a constitution, in the present invention, the touch-panel-use electronic parts 51 which are mounted on the touch-panel-use flexible printed circuit board 50 are intentionally mounted on the lower side of the touch-panel-use flexible printed circuit board 50. This mounting of the electronic parts 51 constitutes one of the technical features of the present invention.

In the constitution of the present invention, however, the touch-panel-use flexible printed circuit board 50 and the main flexible printed circuit board 40 are used. Accordingly, it is necessary to prevent the mechanical interference between the electronic parts of the touch-panel-use flexible printed circuit board 50 and the electronic parts of the main flexible printed circuit board 40.

In FIG. 4, the IC driver 30 is arranged on the terminal portion of the TFT substrate 10 of the liquid crystal cell. Further, the main flexible printed circuit board 40 is connected to the terminal formed on the TFT substrate 10. The main flexible printed circuit board 40 is folded back and extends along the back surface of the liquid crystal display panel. LCD-use electronic parts 41 are mounted on the main flexible printed circuit board 40. Although only one LCD-use electronic part 41 is described in FIG. 4, FIG. 4 schematically shows the constitution of the liquid crystal display device, and in an actual liquid crystal display panel, ten or more LCD-use electronic parts 41 are mounted on the main flexible printed circuit board 40. In FIG. 4, the front window 200 is arranged so as to cover not only the touch panel 100 but also the LCD-use electronic parts 41 mounted on the main flexible printed circuit board 40.

Here, the LCD-use electronic part 41 which is mounted on the main flexible printed circuit board 40 includes a volume for adjusting a screen such as brightness, chromaticity, and the adjustment operation of the screen of the liquid crystal display device is performed by adjusting the volume. To allow a user to perform such an operation, it is convenient for the user that the LCD-use electronic parts 41 which are mounted on the main flexible printed circuit board 40 are arranged on the upper side of the main flexible printed circuit board 40.

However, in the present invention, the LCD-use electronic parts 41 are arranged on the lower side of the main flexible printed circuit board 40. That is, when the LCD-use electronic parts 41 are mounted on the upper side of the main flexible printed circuit board 40, the LCD-use electronic parts 41 interfere with or are brought into contact with the touch-panel-use electronic parts 51 mounted on the touch-panel-use flexible printed circuit board 50 described above. To prevent such interference or contact, in the present invention, the LCD-use electronic parts 41 are arranged on the lower side of the main flexible printed circuit board 40.

On the other hand, when the electronic parts are arranged on the lower side of the main flexible printed circuit board 40, the electronic parts and the mold are brought into contact with each other when the main flexible printed circuit board 40 is folded downwardly. To prevent such a contact, there arises a drawback that a size of the liquid crystal display device in the planar direction becomes large.

The present invention overcomes this problem attributed to the arrangement of the electronic parts on the lower side of the main flexible printed circuit board 40 by forming the front window 200 larger than the liquid crystal display device in size. For example, a fixed printed image such as a logo mark of a mobile phone service company or the like is always arranged on a mobile phone. By imparting such a function to a portion of the front window 200 which is formed by making the front window 200 larger than the liquid crystal display device, and by arranging the electronic parts of the touch-panel-use flexible printed circuit board 50 and the electronic parts of the main flexible printed circuit board 40 on such a portion, it is possible to suppress the large-sizing of the external shape of the mobile phone as a whole.

Further, in the present invention, the electronic parts are arranged on the lower side of the main flexible printed circuit board 40 and, at the same time, the light emitting diodes 70 are also arranged on the lower side of the main flexible printed circuit board 40 in the same manner as other electronic parts. Here, the light emitting diodes 70 are arranged on a portion of the main flexible printed circuit board 40 which is folded back to a back surface of the resin mold 60. Due to such a constitution, when the main flexible printed circuit board 40 is folded back to the back surface of the resin mold 60, the light emitting diodes 70 can be accommodated in recessed portions formed on the resin mold 60. Further, the light emitting diodes 70 are arranged to face an edge portion of a light guide plate 62 in an opposed manner as shown in FIG. 4 thus constituting a portion of the backlight. Here, as the light emitting diodes 70, in this embodiment, white light emitting diodes are used.

In FIG. 4, the liquid crystal display panel is mounted on the resin mold 60. In FIG. 4, the lower polarizer 11 of the liquid crystal display panel is accommodated in the resin mold 60, and the backlight is arranged on a back surface of the lower polarizer 11. The backlight has the following constitution.

The backlight includes a light guide plate 62 which has an edge portion thereof arranged to face the light emitting diodes 70 in an opposed manner. The light guide plate 62 plays a role of directing a light which is radiated from the light emitting diodes 70 and enters light guide plate 62 from a side surface thereof toward a liquid crystal display panel side. The light emitting diode 70 has a large thickness and hence, for reducing the whole thickness of the liquid crystal display device, the light guide plate 62 has a large thickness at a portion thereof which faces the light emitting diodes 70 and a small thickness at a portion thereof which overlaps with optical sheets described later.

In FIG. 4, a reflection sheet 61 is arranged on a lower side of the light guide plate 62. The reflection sheet 61 is provided for reflecting and directing a light which is directed downwardly from the light guide plate 62 toward the liquid crystal display panel side. On the other hand, a group of optical sheets 67 consisting of a lower diffusion sheet 63, a lower prism sheet 64, an upper prism sheet 65 and an upper diffusion sheet 66 is arranged on an upper side of the light guide plate 62.

Figure 5:
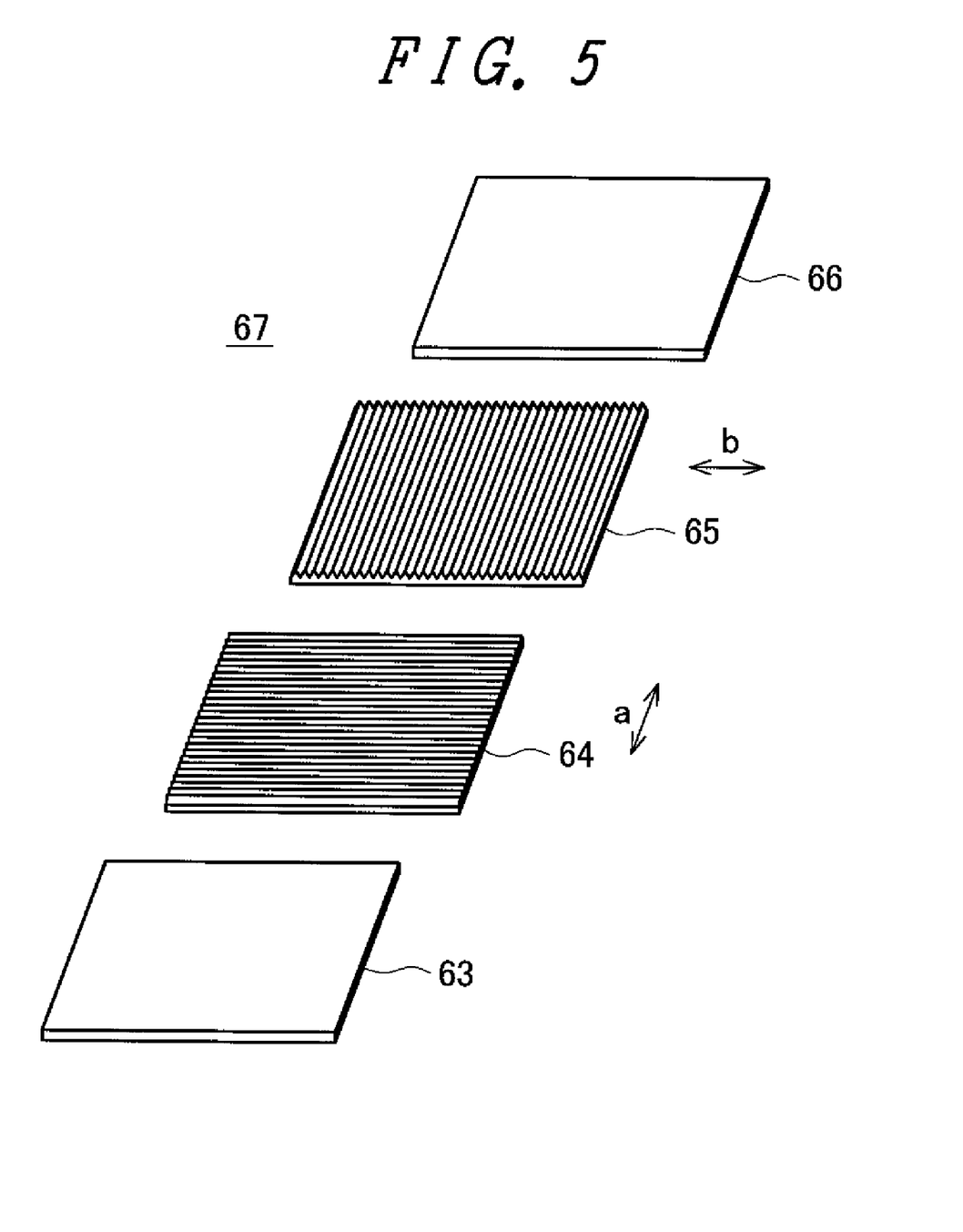
FIG. 5 is an exploded perspective view of an optical sheet group.

FIG. 5 is a perspective view of the group of optical sheets 67. A lowermost sheet described in FIG. 5 is the lower diffusion sheet 63. A light which is radiated toward the liquid crystal display panel side from the light guide plate has brightness irregularities such that a portion of the light guide plate 62 in the vicinity of the light emitting diodes 70 is brighter than other portions of the light guide plate 62. The lower diffusion sheet 63 is provided for alleviating such brightness irregularities so as to form a uniform backlight.

The lower prism sheet 64 is arranged on the lower diffusion sheet 63. As shown in FIG. 5, for example, prisms each of which has a triangular cross section are formed on the lower prism sheet 64 in such a manner that the prisms extend in the lateral direction and are arranged parallel to each other in the longitudinal direction. An arrangement pitch of the respective prisms is set to approximately 50 μm. In FIG. 5, the lower prism sheet 64 plays a role of enhancing the utilization efficiency of light by directing light which tends to spread in the direction "a" toward the direction perpendicular to the lower prism sheet 64.

The upper prism sheet 65 is arranged on the lower prism sheet 64. As shown in FIG. 5, for example, prisms each of which has a triangular cross section are formed on the upper prism sheet 65 in such a manner that the prisms extend in the longitudinal direction and are arranged parallel to each other in the lateral direction. An arrangement pitch of the respective prisms is set to approximately 50 μm. In FIG. 5, the upper prism sheet 65 plays a role of enhancing the utilization efficiency of light by directing light which tends to spread in the direction "b" toward the direction perpendicular to the upper prism sheet 65.

In FIG. 5, the upper diffusion sheet 66 is arranged on the upper prism sheet 65. The upper diffusion sheet 66 has a function of suppressing the generation of moiré on the screen of the liquid crystal display device. That is, the brightness of a light radiated from the lower prism sheet 64 or the upper prism sheet 65 is microscopically changed periodically corresponding to the prism pitch.

On the other hand, on the TFT substrate 10 of the liquid crystal display panel, scanning lines which extend in the lateral direction and are arranged parallel to each other in the longitudinal direction are formed, for example. Accordingly, portions which allow the transmission of light and portions which block light are periodically formed in the longitudinal direction on the TFT substrate 10 due to the presence of the scanning lines. Further, on the TFT substrate 10 of the liquid crystal display panel, video signal lines which extend in the longitudinal direction and are arranged parallel to each other in the lateral direction are formed, for example. Accordingly, portions which allow the transmission of light and portions which block light are periodically formed in the lateral direction on the TFT substrate 10 due to the presence of the video signal lines.

Due to such a constitution, the interference of light is generated between a light which passes through the lower prism sheet 64 and the upper prism sheet 65 and the TFT substrate 10 of the liquid crystal display panel, and this interference of light generates moiré. The upper diffusion sheet 66 plays a role of suppressing the generation of moiré by alleviating the interference between light and the scanning lines or the video signal lines formed on the TFT substrate 10 due to alleviation of the difference in intensity of light which passes through the prism sheets.

Returning to the constitution shown in FIG. 4, the group of optical sheets 67 is overlapped with the light guide plate 62. A gap of approximately 50 μm is formed between the upper diffusion sheet 66 which constitutes an uppermost optical sheet out of the group of optical sheets 67 and the lower polarizer 11 of the liquid crystal display panel. This gap is formed for preventing the generation of flaws on the lower polarizer 11 or the upper diffusion sheet 66 due to rubbing between the lower polarizer 11 and the upper diffusion sheet 66.

In FIG. 4, the main flexible printed circuit board 40 which is connected to the liquid crystal cell and the touch-panel-use flexible printed circuit board 50 which is connected to the touch panel 100 are folded back and extend along the back surface of the liquid crystal display panel. The main flexible printed circuit board 40 and the touch-panel-use flexible printed circuit board 50 are connected to each other at a place not shown in FIG. 4.

As has been explained heretofore, in the present invention, by making the size of the front window 200 large enough to cover the electronic parts of the main flexible printed circuit board 40 and the electronic parts of the touch-panel-use flexible printed circuit board 50, the whole liquid crystal display panel can be protected. Further, a fixed pattern or the like is arranged on the portion of the front window 200 which is formed by making the front window 200 larger than the liquid crystal display panel, it is possible to effectively make use of such a portion.

Due to such a constitution, the electronic parts of the touch-panel-use flexible printed circuit board 50 can be arranged on the lower side of the touch-panel-use flexible printed circuit board 50 and the electronic parts of the main flexible printed circuit board 40 also can be arranged on the lower side of the main flexible printed circuit board 40 thus preventing the interference between the electronic parts of the touch-panel-use flexible printed circuit board 50 and the electronic parts of the main flexible printed circuit board 40.

In the present invention, by arranging not only the electronic parts but also the light emitting diodes 70 on the lower side of the main flexible printed circuit board 40, the light emitting diodes 70 can be arranged on the edge portion of the light guide plate 62 in a state that the light emitting diodes 70 are accommodated in the resin mold 60 when the main flexible printed circuit board 40 is folded back to the back surface of the liquid crystal display panel. By adopting such arrangement, the present invention can acquire following advantageous effects.

The liquid crystal display device to which the present invention is directed is configured such that the touch panel 100 is arranged on the liquid crystal display panel, and the front window 200 is arranged on the touch panel 100. The adhesion between the touch panel 100 and the color filter substrate 20 of the liquid crystal display panel or the adhesion between the touch panel 100 and the front window 200 is performed using the adhesive material or the tacky adhesive material.

In performing the adhesion between the touch panel 100 and the color filter substrate 20 of the liquid crystal display panel or the adhesion between the touch panel 100 and the front window 200, there exists a possibility that air bubbles or foreign materials are entrained in the adhesive material or the tacky adhesive material. In such a case, it is necessary to reproduce an expensive liquid crystal display device. That is, the liquid crystal display device to which the front window 200 is adhered is heated and, thereafter, the front window 200 or the touch panel 100 is peeled off from the liquid crystal display device using a fine piano wire or the like.

In such a peeling-off operation, conventionally, parts such as the main flexible printed circuit board 40, the backlight and the like are all discarded. In such an operation, the light emitting diodes 70 which are relatively expensive are also discarded simultaneously. According to the constitution of the present invention, the light emitting diodes 70 are mounted on the main flexible printed circuit board 40 and hence, by peeling off the main flexible printed circuit board 40 from the liquid crystal display panel before peeling off the front window 200 or the touch panel 100, the light emitting diodes 70 which are relatively expensive parts can be recycled.

As has been explained heretofore, by applying the present invention to the hybrid-type liquid crystal display device, it is possible to prevent the interference or the contact between the electronic parts of the main flexible printed circuit board 40 and the electronic parts of the touch-panel-use flexible printed circuit board 50. Further, conventionally, when a defect is found in the hybrid-type liquid crystal display device after the completion of the hybrid-type liquid crystal display device, there is no way but to discard the light emitting diodes 70. However, according to the present invention, in a reproduction step, it is possible to recycle and reuse the light emitting diodes 70 thus reducing a manufacturing cost of the hybrid-type liquid crystal display device.

Embodiment 2

Figure 7:
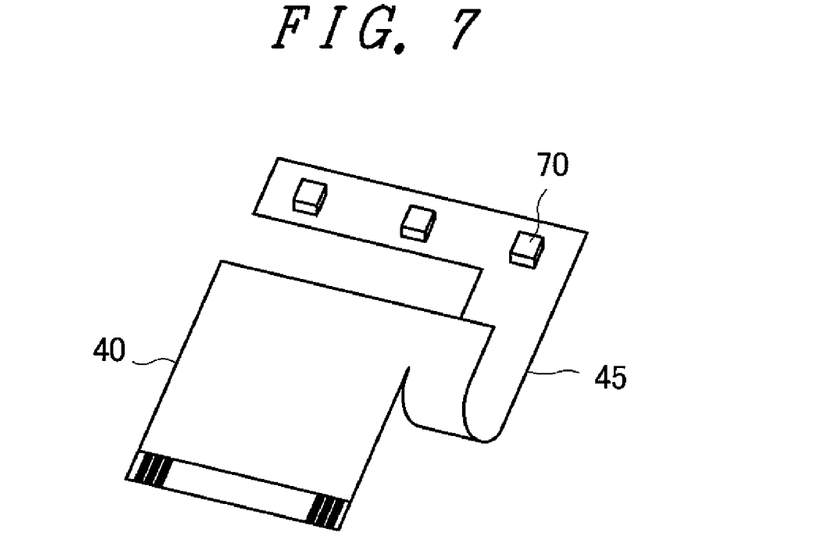
FIG. 7 is a perspective view of a main flexible printed circuit board which is used for a liquid crystal display device of an embodiment 2.

FIG. 7 is a perspective view of a main flexible printed circuit board 40 which is used in a second embodiment of the present invention. In FIG. 7, a light-emitting-diode-use flexible printed circuit board 45 on which light emitting diodes 70 are arranged is branched from the main flexible printed circuit board 40. In FIG. 7, the light-emitting-diode-use flexible printed circuit board 45 is folded back and extends along a back surface of a backlight not shown in the drawing.

In FIG. 7, three light emitting diodes 70 are arranged on the branched light-emitting-diode-use flexible printed circuit board 45. The main flexible printed circuit board 40 is not folded back and extends frontwardly, and electronic parts not shown in the drawing are arranged on a lower side of the main flexible printed circuit board 40.

Figure 8:
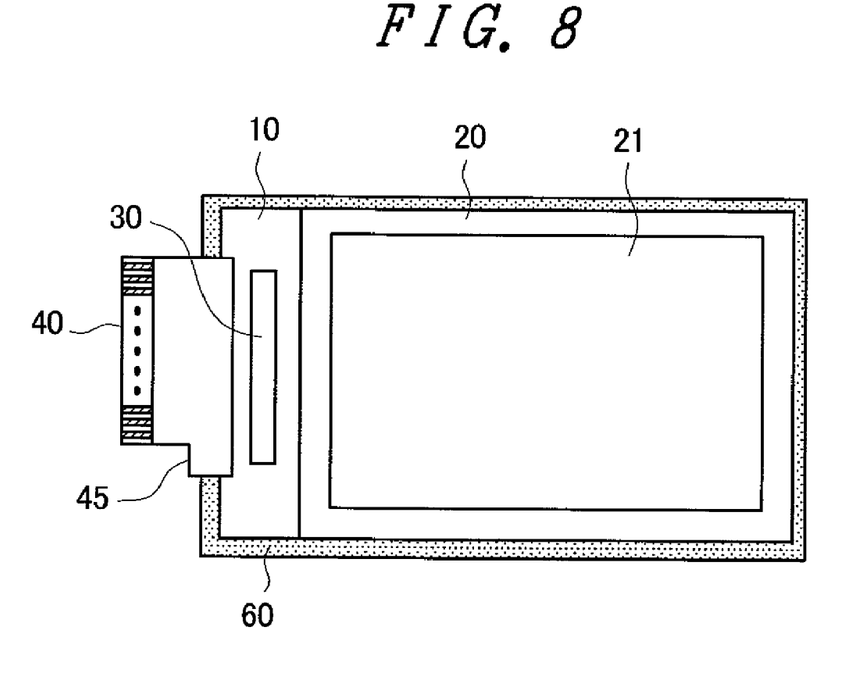
FIG. 8 is a plan view of the liquid crystal display device of the embodiment 2.

FIG. 8 is a plan view showing a state where the main flexible printed circuit board 40 having such a constitution is mounted on a liquid crystal display device. In FIG. 8, although the main flexible printed circuit board 40 is not folded back and extends frontwardly, a portion of the branched light-emitting-diode-use flexible printed circuit board 45 is folded back to a back surface of a resin mold 60.

Figure 9:
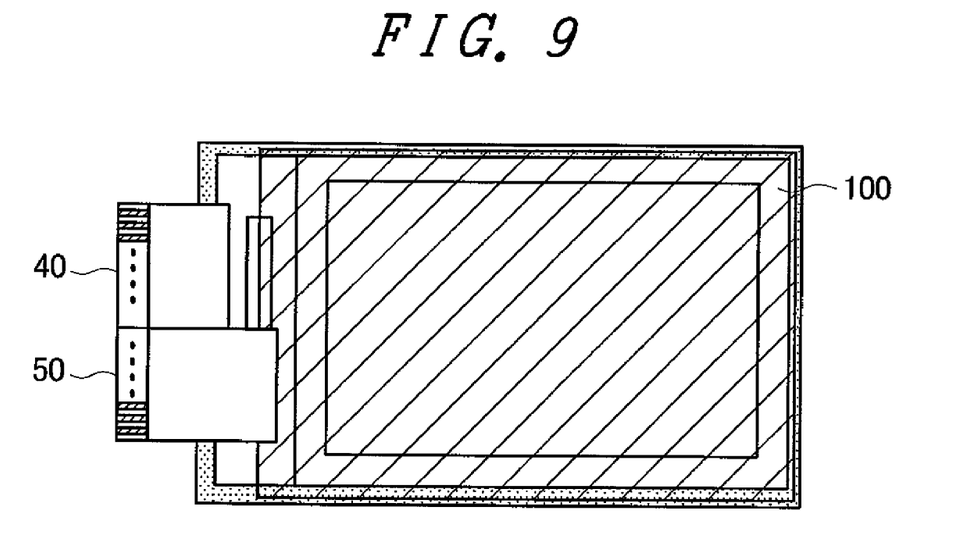
FIG. 9 is a plan view of a liquid crystal display device which is obtained by mounting the touch panel on the liquid crystal display device shown in FIG. 8.

FIG. 9 is a plan view showing a state where a touch panel 100 is mounted on a liquid crystal display device to which the main flexible printed circuit board 40 shown in FIG. 8 is connected. In FIG. 9, a touch-panel-use flexible printed circuit board 50 is not folded back and extends frontwardly. Further, also the main flexible printed circuit board 40 is not folded back and extends frontwardly. The light-emitting-diode-use flexible printed circuit board 45 branched from the main flexible printed circuit board 40 extends to a back side of the touch-panel-use flexible printed circuit board 50 and hence, the light-emitting-diode-use flexible printed circuit board 45 is not shown in FIG. 9.

Figure 10:
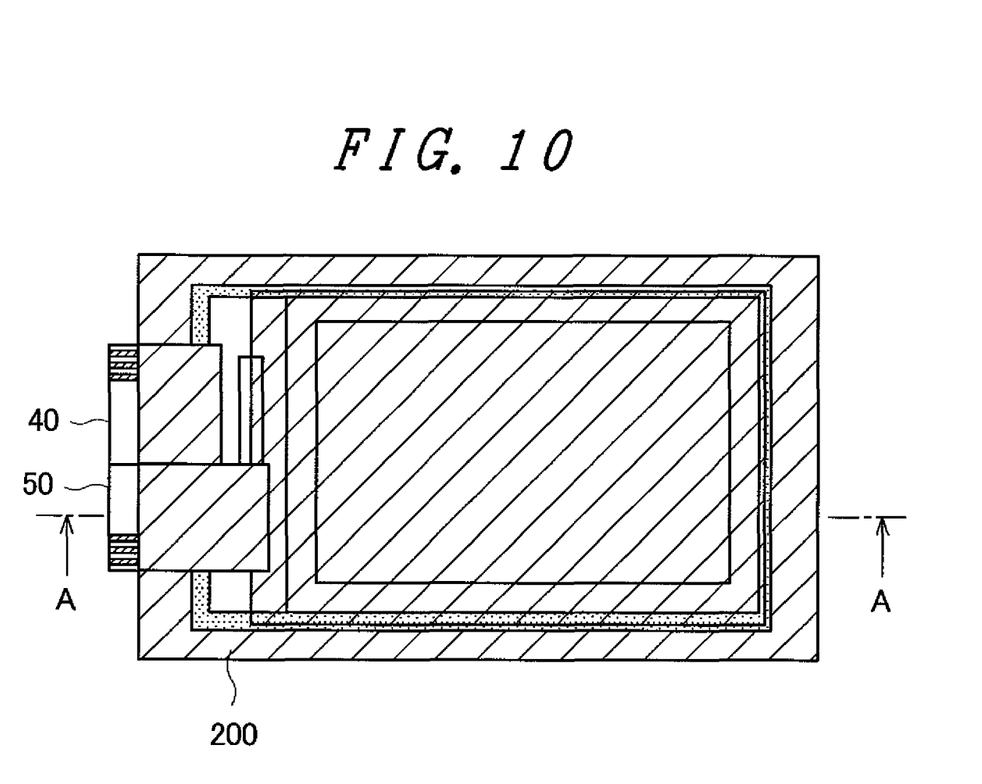
FIG. 10 is a plan view of a liquid crystal display device which is obtained by mounting the front window on the liquid crystal display device shown in FIG. 9.

FIG. 10 is a plan view showing a state where a front window 200 is mounted on the liquid crystal display device on which the touch panel 100 is mounted as shown in FIG. 9. In FIG. 10, the main flexible printed circuit board 40 and the touch-panel-use flexible printed circuit board 50 extend frontwardly. However, both the electronic parts arranged on the main flexible printed circuit board 40 and the electronic parts arranged on the touch-panel-use flexible printed circuit board 50 are arranged below the front window 200 and hence, these electronic parts are not shown in FIG. 10. With respect to the main flexible printed circuit board 40 and the touch-panel-use flexible printed circuit board 50, only a terminal portion of the main flexible printed circuit board 40 and a terminal portion of the touch-panel-use flexible printed circuit board 50 project outwardly from the front window 200.

Figure 11:
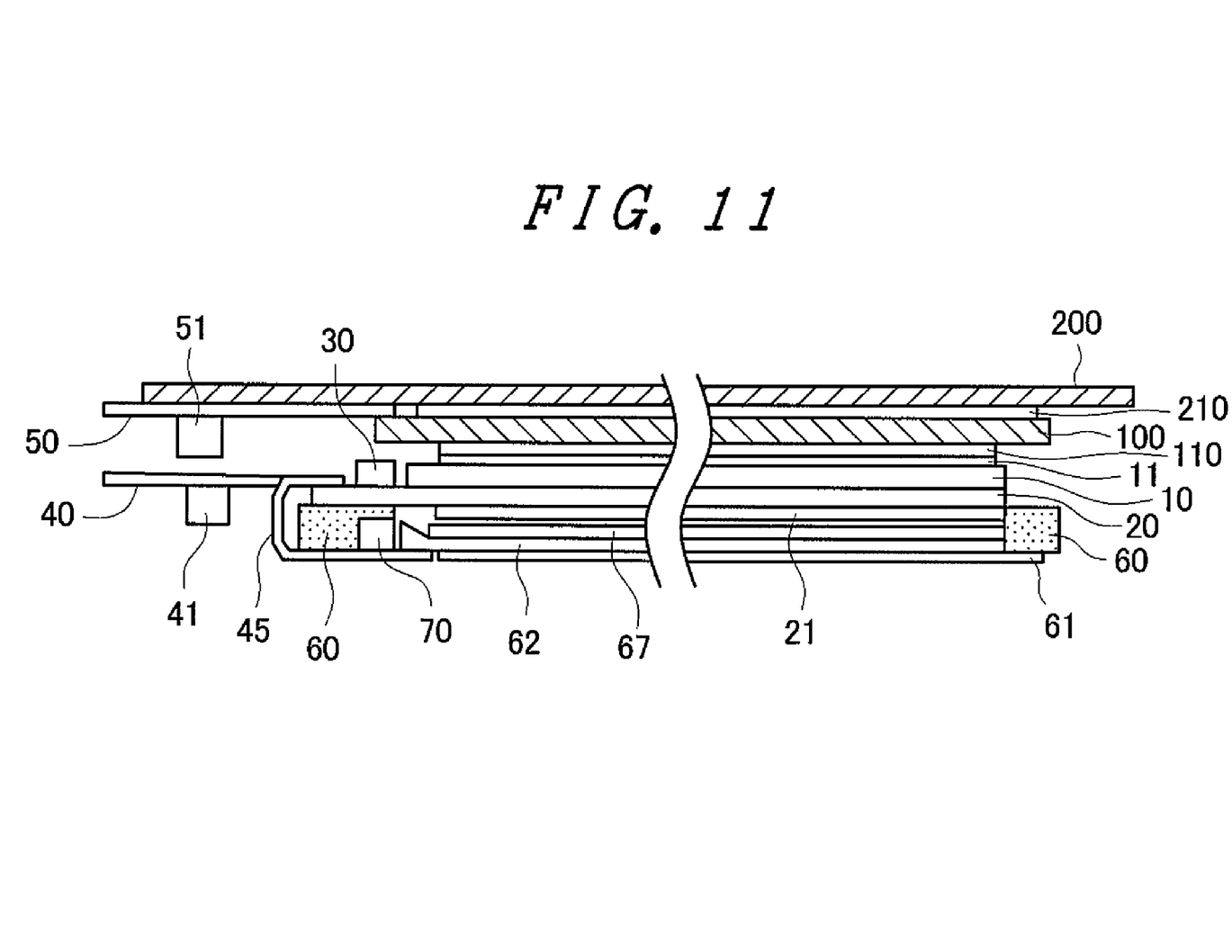
FIG. 11 is a cross-sectional view of the liquid crystal display device shown in FIG. 10.

FIG. 11 is a cross-sectional view taken along a line A-A in FIG. 10. In the A-A cross section, a portion of the light-emitting-diode-use flexible printed circuit board 45 which is branched from the main flexible printed circuit board 40 is shown. In FIG. 11, the liquid crystal display device has the same constitution as the liquid crystal display device shown in FIG. 4 except for the touch-panel-use flexible printed circuit board 50 and a portion of the main flexible printed circuit board 40 and hence, the explanation of other parts of the liquid crystal display device is omitted.

In FIG. 11, the touch-panel-use flexible printed circuit board 50 is not folded back and extends frontwardly, and the electronic parts arranged on the touch-panel-use flexible printed circuit board 50 are arranged below the front window 200. Further, the main flexible printed circuit board 40 is also not folded back and extends frontwardly, and the electronic parts are mounted on a lower side of the main flexible printed circuit board 40. On the other hand, the light-emitting-diode-use flexible printed circuit board 45 is branched from the main flexible printed circuit board 40 and is folded back and extends along a back surface of the backlight.

In the main flexible printed circuit board 40 shown in FIG. 11, all electronic parts except for the light emitting diodes 70 are mounted on the lower side of the main flexible printed circuit board 40. On the other hand, the light-emitting-diode-use flexible printed circuit board 45 is folded back and extends along the back surface of the backlight. On the light-emitting-diode-use flexible printed circuit board 45, only the light emitting diodes 70 are arranged as the electronic parts.

As has been explained heretofore, in this embodiment, all electronic parts which are arranged on the touch-panel-use flexible printed circuit board 50 are arranged on the lower side of the touch-panel-use flexible printed circuit board 50, and are arranged below the front window 200. Further, the electronic parts which are arranged on the main flexible printed circuit board 40 are also arranged on the lower side of the main flexible printed circuit board 40, and are arranged below the front window 200.

According to this embodiment, in the liquid crystal display device, before being assembled in a set such as a mobile phone, the touch-panel-use flexible printed circuit board 50 and the main flexible printed circuit board 40 are not folded back except for the light-emitting-diode-use flexible printed circuit board 45. Accordingly, in a state that the liquid crystal display device is completed, it is possible to prevent the occurrence of side effects or the like attributed to a bending stress caused by folding back the flexible printed circuit board. Here, the light-emitting-diode-use flexible printed circuit board 45 which is branched from the main flexible printed circuit board 40 has a narrow width as shown in FIG. 7 or the like and hence, a bending stress is not serious with respect to the light-emitting-diode-use flexible printed circuit board 45.

Also in this embodiment, all electronic parts except for the light emitting diodes 70 are arranged on the lower side of the touch-panel-use flexible printed circuit board 50 or on the lower side of the main flexible printed circuit board 40 which is not folded back, and are covered with the front window 200 as viewed in a plan view. Accordingly, it is possible to make the liquid crystal display device compact as a whole.

What is claimed is:

1. A liquid crystal display device comprising:
   a liquid crystal display panel and a backlight which are accommodated in a resin mold;
   a touch panel which is adhered to the liquid crystal display panel; and
   a front window which is adhered to the touch panel, wherein
   a main flexible printed circuit board is connected to the liquid crystal display panel, a touch-panel-use flexible printed circuit board is connected to the touch panel,
   electronic parts arranged on the touch-panel-use flexible printed circuit board are arranged on a side opposite to the front window, and electronic parts arranged on the main flexible printed circuit board are arranged on a side opposite to the front window,
   the main flexible printed circuit board is folded back to a back surface of the resin mold, a light emitting diode is arranged on a portion of the main flexible printed circuit board which is folded back to the back surface of the resin mold, and the light emitting diode is accommodated in an area in the resin mold which is covered by the portion of the main flexible printed circuit board which is folded back, which light emitting diode forms a portion of the backlight,
   the touch-panel-use flexible printed circuit board is connected to the main flexible printed circuit board, and is folded back to the back surface of the resin mold, and
   the front window covers the electronic parts arranged on the main flexible printed circuit board and the electronic parts arranged on the touch-panel-use flexible printed circuit board as viewed in a plan view.

2. A liquid crystal display device according to claim 1, wherein the liquid crystal display panel and the touch panel are adhered to each other by a thermoplastic resin, and the front window and the touch panel are adhered to each other by a thermoplastic resin.

3. A liquid crystal display device according to claim 1, wherein the touch panel is an electrostatic touch panel.

4. A liquid crystal display device comprising:
   a liquid crystal display panel and a backlight which are accommodated in a resin mold;
   a touch panel which is adhered to the liquid crystal display panel; and
   a front window which is adhered to the touch panel, wherein
   a main flexible printed circuit board is connected to the liquid crystal display panel,
   a touch-panel-use flexible printed circuit board is connected to the touch panel,
   electronic parts arranged on the touch-panel-use flexible printed circuit board are arranged on a side opposite to the front window, and electronic parts arranged on the main flexible printed circuit board are arranged on a side opposite to the front window,
   the main flexible printed circuit board is folded back to a back surface of the resin mold,
   a light-emitting-diode-use flexible printed circuit board branched from the main flexible printed circuit board is folded back and extends along a back surface of the resin mold, a light emitting diode is arranged on a portion of the light-emitting-diode-use flexible printed circuit board extending along the back surface of the resin mold, and the light emitting diode is accommodated in an area in the resin mold which is covered by the portion of the light emitting diode flexible use printed circuit board which is folded back, which light emitting diode forms a portion of the backlight,
   the touch-panel-use flexible printed circuit board is connected to the main flexible printed circuit board, and is folded back to the back surface of the resin mold, and
   the front window covers the electronic parts arranged on the main flexible printed circuit board and the electronic parts arranged on the touch-panel-use flexible printed circuit board as viewed in a plan view.

5. A liquid crystal display device according to claim 4, wherein only the light emitting diode is mounted on the light-emitting-diode-use flexible printed circuit board.

6. A liquid crystal display device according to claim 1, wherein a portion of the touch-panel-use flexible printed circuit board which is folded back to the back surface of the resin mold extends over a portion of the main flexible printed circuit board which is folded back to the back surface of the resin mold, including a part of the portion of the main flexible printed circuit board which covers the recess in which the light emitting diode is accommodated.

7. A liquid crystal display device according to claim 4, wherein a portion of the touch-panel-use flexible printed circuit board which is folded back to the back surface of the resin mold extends over a portion of the light-emitting diode use flexible printed circuit board which is folded back to the back surface of the resin mold including a part of the light emitting diode use flexible printed circuit board which covers the recess in which the light emitting diode is accommodated.

8. A liquid crystal display device according to claim 1, wherein said area in said resin mold comprises a recess in said resin mold.

9. A liquid crystal display device according to claim 4, wherein said area in said resin mold comprises a recess in said resin mold.

10. A liquid crystal display device according to claim 6, wherein said area in said resin mold comprises a recess in said resin mold.

11. A liquid crystal display device according to claim 7, wherein said area in said resin mold comprises a recess in said resin mold.

* * * * *